United States Patent [19]

Nardin

[11] 4,358,741
[45] Nov. 9, 1982

[54] MICRO TIME AND PHASE STEPPER

[75] Inventor: Roy Nardin, Farmingville, N.Y.

[73] Assignee: ILC Data Device Corporation, Bohemia, N.Y.

[21] Appl. No.: 75,971

[22] Filed: Sep. 17, 1979

[51] Int. Cl.³ .................... H03H 11/20; H03L 7/06
[52] U.S. Cl. .................................. 331/2; 328/155; 331/25; 333/18
[58] Field of Search .................. 331/2, 1 A, 18, 25, 331/31, 38, 39, 40; 328/155; 307/262; 333/18, 139, 144, 152, 164

[56] References Cited

U.S. PATENT DOCUMENTS

| | | | |
|---|---|---|---|
| 3,089,092 | 5/1963 | Plotkin et al. | 328/155 |
| 3,183,447 | 5/1965 | Fair | 333/18 X |
| 3,714,589 | 1/1973 | Lewis | 328/155 |
| 3,955,158 | 5/1976 | Upadhyayula et al. | 333/138 X |

Primary Examiner—Siegfried H. Grimm
Attorney, Agent, or Firm—Weinstein & Sutton

[57] ABSTRACT

A digital time phase shifter for shifting a signal in very precise increments and which performs the steps of: mixing a reference frequency signal with the signal to be time or phase delayed for generating an intermediate frequency signal; selectively delaying (i.e. advancing or retarding) the intermediate frequency signal; and mixing the delayed intermediate frequency signal and reference signal developing an output signal whose frequency is an integer multiple or sub-multiple of the input signal frequency and whose phase delay is proportional to the ratio of the intermediate signal and input signal frequencies. Small delay increments are obtained by judicious selection of the reference frequency. The output frequency may be slowly delayed relative to the input frequency by repeating the delay step. The phase shifter employs a pair of phase-locked loops, digital mixing circuits and a programmable delay generator. The input signal and reference signal are mixed developing an intermediate frequency signal, having a delay determined by the setting of the programmable input. One phase-locked loop and mixer develop said reference signal. The other phase-locked loop and mixer generate the output signal, which is time or phase delayed by increments proportional to the ratio of said intermediate signal and said input signal frequencies.

28 Claims, 5 Drawing Figures

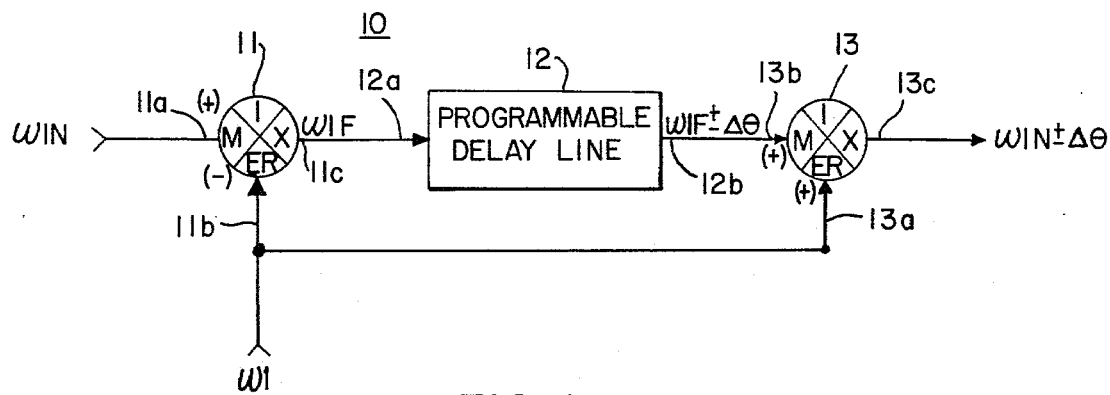
FIG. 1
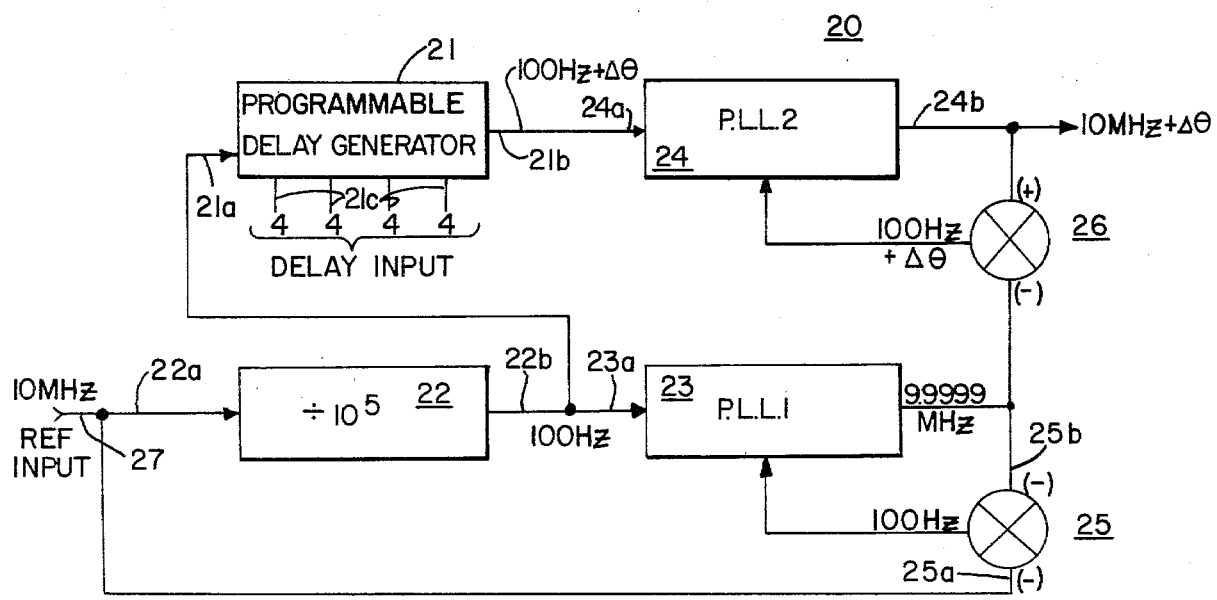
FIG. 2
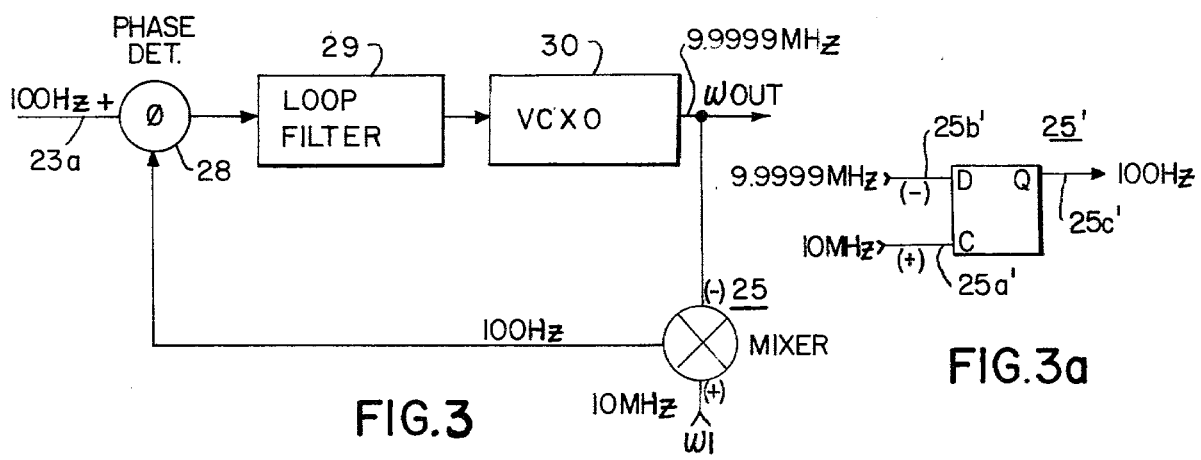
FIG. 3
FIG. 3a

MICRO TIME AND PHASE STEPPER

BACKGROUND OF THE INVENTION

The present invention relates to the provision of accurate high frequency signals which are capable of being adjusted and, more particularly, to phase or time adjustment means for adjusting such high frequency signals by very small increments and in very precise amounts and to a method for making such small, high precision time or phase delays.

The primary application for the instrument of the present invention reside in those fields in which precise time and frequency signals are required and wherein such precise high frequency signals require adjustment. Some applications for adjustment means are cesium clocks which require periodic adjustment due to the fact that they are subjected to drift, as well as other systems such as Loran "C" stations, Omega stations and G.P.S. Systems. A micro time and phase stepper may, in fact, be used to great advantage in any system requiring a precision phase or time controller. As one example, micro time and phase controllers may be advantageously employed in earth stations utilized in satellite communication networks.

Although at least one prior art device exists for providing micro time and phase control, such device has been found to have some significant shortcomings which render its use impractical in certain applications, some of the disadvantages of the prior art device including:

I. the conventional device requires a warm-up time of from four to eight hours prior to use which time is required to enable stabilization of phase shifts in frequency perturbations which are so severe as to render the device useless during the warm-up period;

II. the signal developed by the device exhibits a random phase shift in either direction and the magnitude and occurrence of these phenomena is unpredictable and results in introduction of significant errors into precision timed systems;

III. the minimum time increment resolution is 100 picoseconds which is too coarse (i.e. too large) for the high-stability precision time-keeping systems presently being used; and IV. when the input clock whose signal is to be time or phase delayed is replaced, there is an accumulated time loss which occurs when one clock is removed from the input jack and another is connected.

BRIEF DESCRIPTION OF THE INVENTION

The present invention is characterized by being comprised of means for performing a method for delaying a signal which method is superior to conventional systems in that it provides higher resolution while at the same time eliminating all of the inherent problems of existing equipment including elimination of all of the disadvantages set forth hereinabove.

The present invention is characterized by being comprised of apparatus which is based upon the principles of multiplication of trigonometric functions; namely, cosine waves.

The method of the present invention is manifested in apparatus adapted to accept an input signal and a digital word which represents an amount of time or phase shift by which the output signal is to be displaced from the input signal and which imparts a specific time or phase difference between the input and output signals.

The output signal may be the same frequency as the input or an integer multiple or sub-multiple of the input signal. Thus, the output signal will always be time displaced by an amount equal to the aforementioned digital command word regardless of the frequency of the output signal. The phase angle displacement, however, is a function of the output frequency.

The micro time and phase stepper of the present invention may be employed to impart either a static shift or a dynamic shift upon the output signal. The static shift involves the setting of thumbwheel switches or the equivalent, to a value representing the desired delay displacement. The output is then shifted in accordance with the set amount.

A dynamic shift is accomplished by imparting a displacement to the input signal which displacement increases or decreases as a function of time. For example, the output signal can be set to increment one nanosecond per second, i.e. $\Delta F/F = 1 \times 10^{-9}$. This capability may, in one preferred embodiment, be implemented by updating a programmable rate counter at a one second rate. The parallel outputs of the rate counter are then utilized as a digital word applied to the time delay counter for controlling the time increment.

The dynamic shift capability enables the micro time and phase stepper to impart very small frequency changes to the output signal, which is quite important in precision time systems.

The minute frequency variations are based upon the relationship:

$$\omega = d\theta/dt \tag{1}$$

and $$d\theta = 2\pi \Delta t/T \tag{2}$$

Where:
$\Delta t$ = the time shift of the output signal
$T$ = Period of the output signal
$dt$ = the rate of time change.
Combining equations (1) and (2):

$$\Delta \omega = 2\pi \Delta t/T \, dt \tag{3}$$

From equations (2) and (3) it can be seen that the phase shift and frequency variation, $\Delta \omega$ is a function of the period of the output signal. The time shift, $\Delta t$ is constant and does not depend upon the output frequency.

The apparatus of the present invention in one preferred embodiment incorporates a programmable delay generator which delays an intermediate frequency by an amount determined by the setting of the programmable delay generator. The intermediate frequency is preferably developed by means including a phase-locked loop which generates a reference frequency signal, mixes the reference frequency signal with the input signal to develop a difference signal which is substantially the same as said intermediate frequency signal and which compares said intermediate signal with said difference frequency signal for regulating the reference signal being generated. A second phase-locked loop generates an output signal of the desired delay, mixes the delayed output signal with said reference frequency signal to generate a second difference signal substantially equal to said intermediate frequency signal and compares the second difference signal against said delayed intermediate frequency signal to adjust said delayed output signal. By selecting a reference signal having a frequency which is close to said input signal it is possible to time or phase delay the input signal by very small increments, the total number of such increments being determined by the setting of said programmable delay generator.

The programmable delay generator may be operated by either static or dynamic time or phase delay means to develop either a static or dynamic delay. The static delay may be obtained through the setting of a plurality of thumbwheel switches including logical circuitry for converting the thumbwheel switch settings into binary coded decimal signals which are coupled to appropriate stages of the programmable delay generator. The dynamic shift may be obtained by altering the output of an oscillator by means of a rate generator which is adjustable to select the desired rate and by converting said rate of change signals into binary coded signals which are coupled to appropriate stages of said programmable delay generator by divide-by-N (i.e. ÷N) counter units driven by said rate generator.

The use of the above described implementation reduces the number of filters required, thus eliminating the errors such filters introduce such as errors and drifts into the output timing.

OBJECTS AND BRIEF DESCRIPTION OF THE FIGURES

It is therefore one object of the present invention to provide a novel method for delaying a high frequency signal by a precise amount through the employment of a reference signal which is mixed with the input signal to develop an intermediate frequency signal; delaying the intermediate frequency signal by a preset amount and mixing the delayed intermediate frequency signal with said reference signal to develop an output signal whose frequency is the same as the input signal and is delayed by one or more increments which are a function of the ratio of the frequencies of the intermediate signal and the input signal.

Still another object of the present invention is to provide novel apparatus for delaying an input signal by a predetermined amount in either a static or dynamic fashion and which employs digital-type implementation in the form of phase-locked loops for respectively developing a reference signal, an output signal and an intermediate signal; a programmable delay generator for delaying the intermediate signal by an amount determined by the setting of the programmable delay generator wherein the frequency of the output signal developed by one of said phase-locked loops is the same as said input signal and wherein the delay increments are a function of the ratio of the frequencies of the intermediate frequency in the input frequency and wherein the number of delay increments is determined by the setting of the programmable delay generator.

The above as well as other objects of the present invention will become apparent when reading the accompanying description and drawings in which:

FIG. 1 is a block diagram showing a simplified arrangement of the method and apparatus of the present invention which is useful in describing the theory of the invention.

FIG. 2 is a block diagram, showing a hardware implementation of one preferred embodiment of the present invention.

FIG. 3 is a block diagram showing one of the phase locked loops of FIG. 2 in greater detail.

FIG. 3a is a simplified block diagram showing one hardware implementation for the mixers employed in the preferred embodiment of FIG. 2.

DETAILED DESCRIPTION OF THE INVENTION

Figure 4:
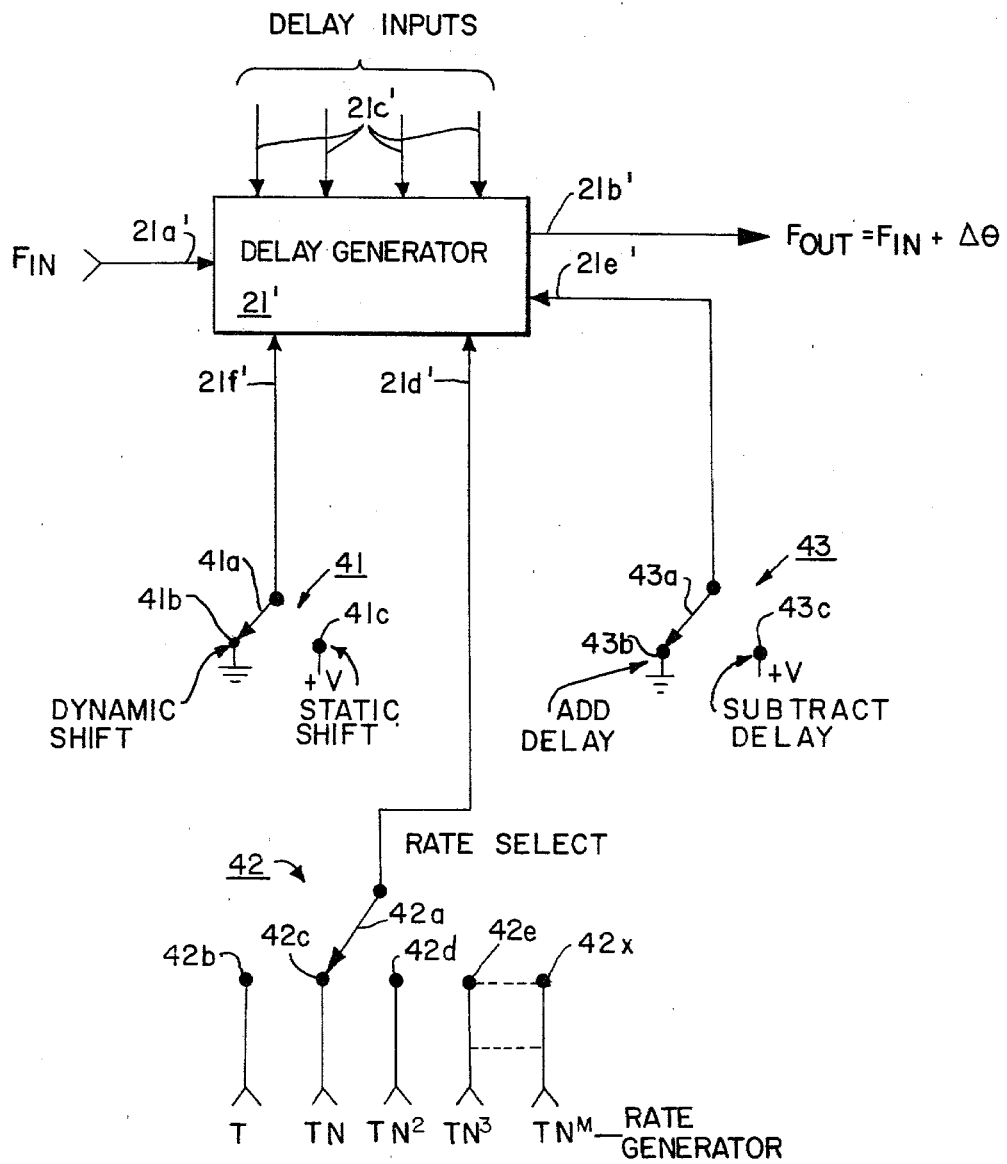
FIG. 4 is a block diagram showing the programming logic which may be utilized to operate the programmable delay generator of FIG. 2.

The present invention utilizes the principle of multiplication of trigonometric functions; namely, cosine waves. FIG. 1 shows a simplified block diagram of a micro time and phase stepper apparatus 10 which illustrates the principles of the present invention.

As shown in FIG. 1, the micro time and phase stepper 10 employs a first mixer 11 which accepts signals respectively having an input frequency $\omega_{IN}$ at its input 11a and an offset frequency $\omega_1$ at its input 11b, to produce an intermediate frequency signal $\omega_{IF}$ at its output 11c whose frequency is equal to the difference between the frequency of the input signal and the frequency of the offset signal. The intermediate frequency signal is then delayed in time by a programmable delay line 12, the time delay imparting a phase shift, $\pm\theta$ to the intermediate frequency applied to input 12a, said delayed signal appearing at output 12b. The phase shifted (i.e. delayed) intermediate frequency is then mixed with the offset frequency $\omega_1$ by means of a mixer 13 receiving the offset frequency $\omega_1$ at its input 13a and the delayed intermediate frequency at its input 13b. Mixer 13 produces a sum frequency which is equal to the input frequency $\omega_{IN}$ with the phase shift of $\pm\Delta\theta$ at output 13c. The phase shift corresponds to a time delay (or advance) of the output signal with respect to the input. This concept will now be clarified by a mathematical analysis as follows:

The output of mixer 11 is described mathematically in equation (4) as follows:

$$\cos \omega_{IN}t \cos \omega_1 t = \cos(\omega_{IN}+\omega_1)t + \cos(\omega_{IN}-\omega_1)t \quad (4)$$

Only the cosine term representing the difference is of interest. Thus, $$\omega_{IF} = \cos(\omega_{IN}-\omega_1)t \quad (5)$$

The intermediate frequency is passed through the programmable delay line 12 whereby equation (5) is modified in a manner set forth by equation (6); namely, $$\omega_{IF} \pm \Delta\theta \quad (6)$$

where $\Delta\theta$ is given by:

$$\Delta\theta = \Delta t_1(2\pi)/T_{IF} \text{ radians} \quad (6A)$$

where t1 = the time delay of the programmable delay line and, $T_{IF}$ = the period of the intermediate frequency $\omega_{IF}$ The operation of mixer 13 is given by equation (7) as follows:

$$\begin{aligned} \cos \omega_1 t \cos (\omega_{IF} t \pm \Delta\theta) = &\cos \\ &[(\omega_1 + \omega_{IF})t \pm \Delta\theta] + \cos [(\omega_1 - \omega_{IF})t \pm \Delta\theta] \end{aligned} \quad (7)$$

Substituting equation (5) into the sum term of equation (7), the output becomes:

$$\cos [(\omega_1 + \omega_{IN} - \omega_1)t \pm \Delta\theta] \quad (8)$$

Simplifying equation (8):

$$\cos (\omega_{IN} t \pm \Delta\theta) \quad (9)$$

From equation (9) it can be seen that the output frequency, i.e. the frequency of the output signal, is equal to the frequency of the input signal, but is shifted in phase by an amount equal to the phase shift of the intermediate frequency which phase shift is expressed in radians. The relationship between the output phase shift in radians and the time displacement of the output signal is given by equation (10):

$$\Delta\theta = \Delta t_2 (2\pi)/T_2 \quad (10)$$

where:
$\Delta t_2$ = Time delay of the output signals
$T_2$ = Period of the output signal $\omega_2$ The phase shift given by equation (10) is equal to the phase shift given by equation (6A). This is true because a mixer (i.e. mixer 13) imparts the same phase shift in radians to its output that was present on its inputs. This is demonstrated mathematically as shown by equation (7).

Equations (6A) and (10) can be set equal to one another and the time shift imparted to the output signal can be determined thus, $$\Delta t_2 (2\pi)/T_2 = \Delta t_1 (2\pi)/T_{IF} \quad (11)$$

rearranging and simplifying terms:

$$\Delta t_2 \Delta t_1 T_2/T_{IF} \quad (12)$$

Since $T_2 = 1/F_2$ and $T_{IF} = 1/F_{IF}$ (13)

We thus obtain:

$$\Delta t_2 = \Delta t_1 F_{IF}/F_{OUT} \quad (14)$$

Since $F_{IN} F_{OUT}$ then:

$$\Delta t_2 = t_1 F_{IF}/F_{IN} \quad (15)$$

Equation (15) states that the time displacement of the output frequency is equal to the time delay of the programmable delay line multiplied by the ratio of the intermediate and output (i.e. input) frequencies. Although the simplified embodiment of FIG. 1 is useful in describing the theory of the time delay technique of the present invention, it is impractical to build the micro time and phase stepper in accordance with the simplified arrangement shown in FIG. 1 due to the fact that the filters required at the output of the mixer circuits 11 and 13 (and not shown in FIG. 1 for purposes of simplicity) cause errors and drifts in the output timing and further due to the fact that the delay line shown in FIG. 1 is also impractical.

As a result, the micro time and phase stepper may be implemented through the use of digital techniques employing phase-locked loops thereby eliminating the need for filters and simplifying the digitally controlled time delay. FIG. 2 shows a functional block diagram of the micro time and phase stepper 20 of the present invention which employs first and second phase-locked loops 23 and 24, mixers 25 and 26, a programmable delay generator 21 and a fixed divider 22. Although the description of the embodiment 20 of FIG. 2 sets forth discrete values for the frequencies of input, offset, intermediate and output signals, it should be understood that the selection of the frequency of each of the signals employed is dependent only upon the particular delay increments desired, although the system 20 is clearly most advantageously designed for providing very fine (i.e. small) increments of delay relative to the frequency of the signal to be developed.

As shown in FIG. 2, a 10 MHz reference input signal from a suitable source (not shown) such as a cesium clock, for example, is applied to input terminal 27 which is coupled to input 22a of $\div 10^5$ divider circuit 22 and (+) input 25a of mixer 25. Divider circuit 22 divides the 10 MHz reference input signal down to a 100 HZ signal which signal is employed as a reference for the phase-locked loop 23 employed to develop the 9.9999 MHz phase-locked loop which represents the phase-locked offset frequency, said 100 Hz signal being applied at input 23a of phase-locked loop 23.

FIG. 3 details the implementation of the phase-locked loop wherein input 23a is coupled to one input of phase detector 28 whose other input is coupled to the output of mixer 25. The output of phase detector 28 is coupled to the input of loop filter 29 which is a low pass filter which serves to pass only the d.c. component of the phase detector output, which level is coupled to the input of voltage controlled crystal oscillator 30. The voltage controlled crystal oscillator 30 generates a signal which is regulated by a d.c. signal representing the relative phase of the 100 Hz signal developed by mixer 25 and that developed by divider circuit 22 in order to generate a highly accurate reference or offset signal having a frequency of 9.9999 MHz.

The phase-locked loop 23 thus develops a stable coherent offset frequency. The mixer 25 is preferably a type "D" flip-flop, connected as shown in FIG. 3a in which the bistaple flip-flop 25' receives the offset frequency (9.9999 MHz) at its "D" input 25b' and receives the reference input (10 MHz) at its C (clock) input 25a' and develops an output square wave at its Q output 25c' which signal has a frequency equal to the difference between the frequencies respectively applied to the "D" and clock (C) input. The nature of the type "D" flip-flop 25' is such that the Q output 25c' follows the level at the D input 25b' upon the occurence of a clock pulse at 25a'. The use of the type "D" flip-flop 25' as a mixer is highly advantageous since no additional filtering of the Q output 25c' is required.

The 100 Hz signal developed at the output 22b of divider 22 is applied to the input 21a of programmable delay generator 21 which delays the 100 Hz intermediate signal as a function of the delay magnitude which is preset into the programmable inputs 21c. Programmable delay generator 21 receives each 100 Hz pulse developed at the output of the $\div 10^5$ divider circuit 22, which pulses are applied to the input 21a of the programmable delay generator 21.

Generator 21 imposes the prescribed number of delay increments so that output 21b generates a 100 Hz output signal which is displaced in time from the input 100 Hz pulse by an amount equal to the basic delay increment of delay generator 21 multiplied by the desired total number of delay increments in accordance with its preprogrammed setting at 21c. Thus, for each 100 Hz pulse appearing at input 21b, there is a corresponding 100 Hz pulse appearing at output 21b, which is further delayed from each 100 Hz pulse applied to input 21a by an amount equal to the preprogrammed setting of the programmable delay generator 21. In the example given, the delayed 100 Hz output pulses have a minimum delay increment of 100 nanoseconds and a maximum delay of 999.9999 microseconds. The time delay between two successive 100 Hz pulses can be converted to a phase difference through the use of equation (6A).

The delayed 100 Hz output pulses are applied to the input 24a of phase-locked loop 24 which cooperates with mixer 26 to develop an output signal whose frequency is the same as the reference input (or a multiple or submultiple of the reference input) applied at input terminal 27 and having a delay represented by equation (15).

The transfer function of phase-locked loop 24 given by equation (16), as follows:

$$\Delta\theta_{OUT}=[\Delta\theta_{IN}/(1+F(s)K/S)]+[\theta_1/(1+F(s)K/S)] \quad (16)$$

Where:
$\theta_{IN}$ = Change in phase of the input signal
$\theta_1$ = the phase of $\omega_1$
$F(s)$ = Transfer function of the loop filter
$K/S$ = Loop gain In equation (16) it is clear that as the phase of the input signal changes, the output phase varies by the same amount. This being the case, equation (15) can be utilized to determine the time displacement of the output MHz signal, wherein:

$$\Delta t_{10\ MHz}=\Delta t_{100\ Hz}(1\times 10^2)/(1\times 10^7)=\Delta t_{100\ Hz}(1\times 10^{-5}) \quad (17)$$

The phase-locked loop 24 is substantially the same as that shown in FIG. 3 wherein a phase detector (28 in FIG. 3) compares the delayed output signal of programmable delay generator 21 against the output signal appearing at the output of a mixer (mixer 26 in FIG. 2). The voltage controlled oscillator 30 which in the case of phase-locked loop 24 is designed to generate a 10 MHz signal, is coupled to the phase detector 28 through a loop filter 29 and has its output fed back to phase detector 28 through the mixer (mixer 26 shown in FIG. 2).

The preceding description details the operation of the micro time and phase stepper 20 of FIG. 2 to demonstrate the manner in which the system 20 may be utilized to digitally time shift or phase shift a frequency in very fine increments. It should be understood that the principles described herein are not limited to the frequencies given and that any frequency may be delayed and further that the system may be designed for any desired time or phase increment based upon the analysis presented. The phase or time delay can be incremented statically by inserting a fixed input into delay generator 21 or dynamically by continuously incrementing or decrementing the delay input at a predetermined rate.

FIG. 4 is a simplified block diagram of a delay generator implementation. As shown in FIG. 2 $F_{IN}$ applied at input 21a' could be 100 Hz. or some smaller or larger frequency, if desired. The purpose of the delay generator 21' is to generate a predetermined number of relatively coarse time delay increments. These increments are processed by the previously described circuits to produce very fine (i.e. "small") time increments.

The delay generator 21' is capable of introducing a static phase or time shift which will displace the output 24b (see FIG. 2) of the Micro Time and Phase Stepper 20 by a fixed amount when referred to the input 27. As an example, in FIG. 2 the range of static phase shift at the output of the Micro Time and Phase Stepper 20 is $\Phi=360°$ in 3.6 milli degree increments, while the static time shift is $\pm 100$ NS ($100\times 10-0$ seconds) in 1 picosecond ($1\times 10-12$ second) increments.

Using the techniques previously described, the output of the Micro Time and Phase Stepper 20 as shown in FIG. 2 has a resolution of 10–12 seconds, but the delay generator requires a resolution of only 100 nanoseconds (N.S.) 10–7 seconds).

The delay generator 21' is also capable of introducing dynamic or continuous phase or time shifts which, when translated to the output 24b of the Micro Time and Phase Stepper 20 produces very fine precise frequency offsets at a predetermined adjustable rate.

As shown in FIG. 4, there is a rate input 21d' feeding the delay generator 21'. The rate can be selected in a power series increment. For example, if T=0.1 seconds, M=6, and N=10, the rate range would be from 0.1 seconds to 100 K seconds.

In the dynamic or continuous mode of operation, a fixed delay would be added or subtracted from the output of the Micro Time and Phase Stepper 20 once per rate cycle. As an illustration if the rate was 100 S and the delay was set to 1 NS the output of the Micro Time and Phase Stepper 20 would be offset 1 pulse per $10^{-11}$ seconds, i.e. $1PP10^{-11}$ seconds compared to the input 10 MHZ signal. The governing mathematical relationships are given in equations (1) through (3) hereinabove.

The delay generator 21' may be implemented in many ways including digital and analog approaches.

The delay generator 21' may, for example, be an analog delay line settable by input 21c, to provide up to 360° of phase angle delay which is inversely related to the frequency of the input signal. Thus, for a 100 HZ input, in accordance with the example given in FIG. 2, the maximum delay is 10 milliseconds. The delay may, for example, be applied in 0.36° increments from one up to a total of one-thousand increments for a full 360° delay capability. By imposing the delay increments on an intermediate signal of low frequency (100 HZ in the example given in FIG. 2) and then increasing the intermediate frequency (with the delay imposed) the delay increments in the output signal are quite fine and are given in accordance with the ratio of the frequencies of the intermediate and input signals as set forth in equation (15) set forth above. A static delay operation is obtained by setting switch arm 41a of switch 41 to engage contact 41c to control the delay generator to static operation.

The system is capable of imposing a dynamic delay by repeatedly imposing a given static delay to the intermediate signal a selected number of times. Switch arm 41a is set to engage contact 41b. Switch arm 42a of rate select switch 42 is set to engage one of the contacts 42b through 42x to select the desired rate. For example, for T=0.1 second N=10 and M=0,1,2,3 . . . ,M; rates of from 0.1 seconds to $10^5$ seconds may be selected where ($0\leq M\leq 5$). Assuming switch arm 42a engages contact 42c a delay having a total number of increments determined by the setting of inputs 21c' will be imposed every ten seconds. By setting arm 42a to engage contact 42b the total number of delay increments is determined by the setting of the delay generator 21' every 0.1 seconds. Repeatedly imposing a precise phase delay at regular intervals enables the Micro Time and Phase Stepper 20 to provide very small frequency changes in the output signal relative to the input signal, further increasing the versatility of the Micro Time and Phase Stepper.

Although the above example is directed toward imposing delay increments upon the signal applied to input 21a' it should be understood that the delay increments may be removed by setting switch arm 43a to engage contact 43c to "remove" delay increments and thereby advance the output signal relative to the input signal with the total advance in phase being a function of the basic delay increment times the total number of delay increments set into delay generator 21' by inputs 21c'. Obviously, when the output signal is to be retarded relative to the input signal, switch arm 43a is set to engage contact 43b.

A latitude of modification, change and substitution is intended in the foregoing disclosure and, in some instances, some features of the invention will be employed without a corresponding use of other features. Accordingly, it is appropriate that the appended claims be construed broadly in a manner consistent with the spirit and scope of the invention herein.

What is claimed is:

1. A method for imparting a phase shift to an input signal having a first frequency $f_{in}$, in accordance with digital control data, comprising the steps of:
   providing digital control data representing the desired delay;
   mixing the input signal with a reference signal having a second predetermined frequency to generate an intermediate signal having a frequency less than said first frequency;
   delaying said intermediate signal a predetermined adjustable amount in accordance with the digital control data; and
   mixing said reference signal with said delayed intermediate signal to generate a delayed output signal, which delay is directly proportional to the frequency of said intermediate signal and inversely proportional to the frequency of said input signal.

2. The method of claim 1 wherein the value of said delay in said output signal is made increasingly smaller by selecting a reference signal whose frequency is increasingly closer in value to said frequency of said input signal.

3. The method of claim 1 wherein the value of the delay in said output signal is reduced by increasing the frequency of said input signal.

4. A method for imparting a delay to an input signal having a predetermined frequency $f_{in}$ comprising the steps of:
   mixing the input signal with a reference signal to generate a second signal of an intermediate frequency $f_{if}$; and
   delaying the second signal by a predetermined amount;
   generating an output signal;
   mixing said output signal with said reference signal to generate a difference signal; comparing said difference signal and said delayed second signal and adjusting the output signal whereby the delay of the output signal is directly proportional to the frequency of said intermediate signal and inversely proportional to the frequency of said input signal.

5. A method for imparting a delay to an input signal having a first predetermined frequency, in accordance with a digital control code, comprising the steps of:
   providing a digital control code representing the desired delay;
   generating a reference signal of a predetermined frequency;
   mixing said input signal and said reference signal to generate an intermediate signal whose frequency is the difference between said input signal and said reference signal;
   delaying said intermediate signal by a predetermined adjustable amount determined by the digital control code; and
   mixing said delayed intermediate signal and said reference signal to produce an output signal having a frequency substantially equal to said input signal and being delayed relative to said input signal by an amount which is directly proportional to the frequency of said intermediate signal.

6. A method for delaying an input signal having a frequency $f_{in}$ by a controlled amount comprising the steps of:
   generating a reference signal having a predetermined frequency;
   mixing said reference signal and said input signal to generate an intermediate signal whose frequency is the difference between the frequencies of said input signal and said reference signal;
   independently generating a second intermediate signal whose frequency is equal to said first intermediate signal by dividing down said input signal;
   adjusting the accuracy of said reference signal by comparing said second intermediate signal and said first mentioned intermediate signal;
   delaying one of said intermediate signals by a predetermined amount; generating a delayed output signal, said output signal being delayed relative to said input signal by an amount which is a function of the ratio of the frequencies of said intermediate signal and said input signal;
   mixing said output signal and said reference signal to generate a second delayed intermediate signal; and
   comparing said first and second delayed intermediate signals to adjust the output signal in accordance with the results of said comparison.

7. A method for delaying an input signal by a controlled amount comprising the steps of:
   generating a reference signal having a predetermined frequency;
   mixing said reference signal and said input signal to generate an intermediate signal whose frequency is the difference between the frequencies of said input signal and said reference signal;
   independently generating a second intermediate signal by dividing down said input signal;
   adjusting the accuracy of said reference signal by comparing said second intermediate signal and said first mentioned intermediate signal;
   delaying one of said intermediate signals by a predetermined amount;
   generating an output signal which is delayed relative to said input signal;
   mixing said output signal and said reference signal to produce a third intermediate signal whose frequency is equal to the frequency of said second intermediate signal and said first mentioned intermediate signal; and comparing said delayed intermediate signal and said third intermediate signal for regulating the frequency of said output signal.

8. Means for imparting a controlled phase shift to an input signal having a predetermined frequency $f_{in}$, comprising:

first means for receiving said input signal;

a reference signal source having a predetermined frequency $f_{REF}$;

first mixer means for mixing said input signal with said reference signal to generate an intermediate signal having a frequency $f_{IN}$ less than said input signal;

delay means for imparting a predetermined delay to said intermediate frequency signal in accordance with the desired phase shift;

adjustable generating means for generating an output signal;

second mixer means for mixing said intermediate signal with said output signal for generating a difference signal; and detector means responsive to said difference signal for adjusting said adjustable generating means to adjust the delay of the output signal relative to the input signal, said output signal being delayed by an amount controlled by said second means and the frequency of said intermediate signal.

9. Apparatus for imparting a delay to an input signal having a predetermined frequency $f_{in}$, comprising:

first means for generating a reference signal having a predetermined frequency;

second means for mixing said reference signal and said input signal to generate a first intermediate signal whose frequency is the difference between the frequencies of the input and reference signals;

third means for reducing the frequency of the input signal to generate a second intermediate signal whose frequency is substantially equal to the frequency of said first intermediate signal;

said third means including means for imparting a delay to said second intermediate signal;

fourth means for generating an output signal, said output signal being delayed relative to said input signal;

fifth means for mixing said output signal and said reference signal to generate a third intermediate signal having a frequency equal to said first intermediate signal and a delay equal to the delay in the output signal;

sixth means for comparing the delayed second intermediate signal and said third intermediate signal; and said fourth means including means responsive to said comparison means for regulating the frequency of said output signal.

10. The apparatus of claim 9 wherein said first means comprises a voltage controlled oscillator.

11. The apparatus of claim 9 wherein said fourth means comprises a voltage controlled oscillator.

12. The apparatus of claim 9 wherein said fourth means, said fifth means and said sixth means form a phase-locked loop.

13. The apparatus of claim 12 wherein said phase-locked loop is further comprised of a loop filter coupled between said sixth means and said fourth means for limiting the range of phase angle difference signals passed by said loop filter.

14. The apparatus of claim 9 wherein said third means comprises seventh means dividing the frequency of said input signal to produce an output signal whose frequency is equal to said first mentioned intermediate signal;

eighth means for comparing the output signal of said seventh means with said first mentioned intermediate signal; and said first means including means responsive to said eighth means for regulating the frequency of said reference signal.

15. The apparatus of claim 9 wherein said delay means comprises programmable delay generator means.

16. Apparatus for imparting a delay to an input signal having a predetermined frequency fin comprising:

means for deriving an intermediate signal from said input signal, said intermediate signal having a frequency less than said input signal;

programmable delay generator means having an input for receiving said intermediate signal, said programmable delay generator means including programmable delay input means, whereby a delay is imparted to said intermediate signal appearing at the output of said programmable delay generator means, which delay is a function of the setting of said programmable delay input means; and means responsive to the output of said programmable delay generator means for generating an output signal which is delayed by an amount proportional to the ratio of the frequencies of said intermediate signal and said input signal.

17. Apparatus for imparting a delay to an input signal having a predetermined frequency fin comprising:

first means for deriving an intermediate signal from said input signal, said intermediate signal having a frequency less than said input signal;

programmable delay generator means having an input for receiving said intermediate signal, said programmable delay generator means including programmable delay input means whereby the delay imparted to said intermediate signal appearing at the output of said programmable delay means is a function of the setting of said programmable delay input means;

a first phase-locked loop responsive to said intermediate signal and said input signal for generating a reference signal having a frequency equal to the sum of the frequencies of said input signal and said intermediate signal; and a second phase-locked loop responsive to said reference signal and said delayed intermediate signal for generating an output signal having a delay which is a function of said delay means and the ratio of the frequencies of said intermediate signal and said input signal.

18. The apparatus of claim 17 wherein each of said phase-locked loops is comprised of a phase detector; a voltage controlled oscillator controlled by said phase detector and a mixer having one input coupled to the output of said voltage controlled oscillator and an output, one input of said phase detector being coupled to the output of said mixer.

19. The apparatus of claim 17 wherein said programmable delay generator means comprises a programmable delay line.

20. The apparatus of claim 17 wherein said programmable delay generator means comprises delay means and said programmable means comprising setting means for setting the amount of said delay including switch means for setting the desired delay; and circuit means responsive to said switch means for coupling the values set in said switch means to said programmable delay generator means.

21. The apparatus of claim 20 wherein said setting means comprises a dynamic time delay setting means for repetitively delaying the intermediate signal.

22. The apparatus of claim 21 wherein said dynamic time delay setting means comprises, rate generator means for operating said delay means to repeatedly provide the desired delay increment at a predetermined rate.

23. The apparatus of claim 8 wherein each of said mixers is comprised of a bistable flip-flop means having a first input for receiving the lower frequency signal and a clock input for receiving the higher frequency signal, said flip-flop means including means for generating an output which follows the level at said first input upon the occurrence of each clock pulse.

24. Means for delaying an input signal having a first predetermined frequency comprising:

first means for reducing the frequency of said input signal by a predetermined amount to provide a second signal having a second frequency lower than said first frequency;

digital input means for receiving digital control data;

second means responsive to said digital input means for adjustably delaying the second signal developed by said first means wherein said delay is a function of the digital control data; and third means for increasing the frequency of the second signal produced by said second means to produce an output signal whereby the total delay is composed of a plurality of delay increments which are a function of the ratio of said second and first frequencies.

25. The means of claim 24 wherein said first means comprises reference signal generating means for generating a reference signal having a predetermined frequency;

first mixer means for mixing said reference signal and said input signal for generating said second signal whose second frequency is the difference between the frequencies of said input signal and said reference signal.

26. The means of claim 25 wherein said third means comprises second mixer means for mixing said reference signal and said delayed second signal to generate said output signal whose frequency is the sum of the frequencies of said reference signal and said delayed second signal.

27. The means of claim 24 further comprising fourth means for periodically operating said second means at fixed predetermined time intervals to cause the frequency of said output signal to change at said predetermined rate relative to said input signal.

28. The method of claim 5 wherein the step of delaying said intermediate signal is repeated at a selectable predetermined rate to cause the frequency of said output signal to change at said predetermined rate.

* * * * *

UNITED STATES PATENT AND TRADEMARK OFFICE
CERTIFICATE OF CORRECTION

PATENT NO. : 4,358,741            Page 1 of 2

DATED : November 9, 1982

INVENTOR(S) : Roy Nardin

It is certified that error appears in the above—identified patent and that said Letters Patent is hereby corrected as shown below:

Column 2:

Line 64, after "ference", delete "frequency", and after "reference", insert --frequency--.

Column 5:

Line 39, Equation (12) should be changed to read as follows:
$$\Delta t_2 = \Delta t_1 T_2 / T_{IF}$$

Line 48, change "$F_{IN}F_{OUT}$" to read --$F_{IN}=F_{OUT}$--.

Column 8:

Line 10, change "-0 seconds)" to read -- $-10^{-9}$ seconds)--.

Line 11, change "10-12" to read --$10^{-12}$--.

Line 14, change "10-12" to read --$10^{-12}$--.

Line 16, change "10-7" to read --$10^{-7}$--.

UNITED STATES PATENT AND TRADEMARK OFFICE
CERTIFICATE OF CORRECTION

PATENT NO. : 4,358,741
DATED : November 9, 1982
INVENTOR(S) : Roy Nardin

It is certified that error appears in the above—identified patent and that said Letters Patent is hereby corrected as shown below:

Column 12:

Line 17, change "fin" to --$f_{in}$--.

Line 36, change "fin" to --$f_{in}$--.

Signed and Sealed this

Seventh Day of June 1983

[SEAL]

Attest:

DONALD J. QUIGG

Attesting Officer

Acting Commissioner of Patents and Trademarks